(12) United States Patent
Kahen et al.

(10) Patent No.: US 7,012,942 B2
(45) Date of Patent: Mar. 14, 2006

(54) MODULATING THE PROPERTIES OF THE GAIN REGION AT SPACED LOCATIONS IN AN ORGANIC VERTICAL CAVITY LASER ARRAY DEVICE

(75) Inventors: Keith B. Kahen, Rochester, NY (US); John A. Lebens, Rush, NY (US); Lingadahalli G. Shantharama, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 205 days.

(21) Appl. No.: 10/633,196

(22) Filed: Aug. 1, 2003

(65) Prior Publication Data
US 2005/0025203 A1    Feb. 3, 2005

(51) Int. Cl.
*H01S 3/14* (2006.01)
(52) U.S. Cl. ............................. 372/39; 372/50
(58) Field of Classification Search ............... 372/99, 372/43–50, 75, 96, 70, 22; 428/690
See application file for complete search history.

(56) References Cited

U.S. PATENT DOCUMENTS

| 4,881,236 A | 11/1989 | Brueck et al. | |
|---|---|---|---|
| 6,489,002 B1 * | 12/2002 | Moriya et al. | 428/64.1 |
| 6,853,660 B1 * | 2/2005 | Spoonhower et al. | 372/39 |
| 2003/0016715 A1 | 1/2003 | Furukawa et al. | |

FOREIGN PATENT DOCUMENTS

| EP | 0847094 | 6/1998 |
|---|---|---|
| EP | 1333550 | 8/2003 |
| EP | 1365490 | 11/2003 |
| EP | 1411604 | 4/2004 |
| WO | 02/07235 | 1/2002 |

OTHER PUBLICATIONS

Hung et al, Recent progress of molecular organic electroluminescent materials and devices, Mater. Sci. and Eng. Reports, vol. 39, No. 5-6, Dec. 2002, pp. 143-222.
"Circular Buried Heterostructure (CBH) GaAlAs/GaAs Surface Emitting Lasers" by Susumu Kinoshita et al., IEEE Journal of Quantum Electronics, vol. QE 23, No. 6, Jun. 1987.
"Vertical-Cavity Surface Emitting Lasers: Moving from Research to Manufacturing" Kent D. Choquette, Proceedings of the IEEE, vol. 85, No. 11, Nov. 1997.
"Vertical-Cavity Surface-Emitting Lasers" by Carl W. Wilmsen, Cambridge University Press, 1999.

(Continued)

*Primary Examiner*—Minsun Oh Harvey
*Assistant Examiner*—Tuan N. Nguyen
(74) *Attorney, Agent, or Firm*—Raymond L. Owens (57) ABSTRACT

A vertical cavity laser array device including a substrate, top and bottom dielectric stacks, and an active region for producing laser light. The active region includes one or more periodic gain region(s) and spacer layers disposed on either side of the periodic gain region(s) and arranged so that the periodic gain region(s) is aligned with the antinodes of the device's standing wave electromagnetic field. A structure is provided for modulating the properties of the periodic gain region(s) at spaced locations so as to provide an array of spaced laser pixels which have higher net gain than the interpixel regions; and the spaced laser pixels having the same or different sizes and the spacings between pixels having the same or different lengths to cause the output of the vertical cavity laser array device to produce single or multimode laser output.

26 Claims, 3 Drawing Sheets

OTHER PUBLICATIONS

"2.5 Gbit/s 100m data transmission using graded-index polymer optical fibre and high-speed laser diode at 650nm wavelength" by T. Ishigure et al., Electroncis Letters, Mar. 16th, 1995, Voo. 31, No. 6.

"High-efficiency TEMoo continuous-wave (Al,Ga) aas epitaxial surface-emitting lasers and effect of half-wave periodic gain", by P. L. Gourley, et al., Applied Physics Letter 54 (103), Mar. 27, 1989.

* cited by examiner

MODULATING THE PROPERTIES OF THE GAIN REGION AT SPACED LOCATIONS IN AN ORGANIC VERTICAL CAVITY LASER ARRAY DEVICE

CROSS REFERENCE TO RELATED APPLICATIONS

Reference is made to commonly assigned U.S. patent application Ser. No. 09/832,759 filed Apr. 11, 2000 by Keith B. Kahen et al.; commonly assigned U.S. patent application Ser. No. 10/066,936 filed Feb. 4, 2002 entitled "Organic Vertical Cavity Lasing Devices Containing Periodic Gain Regions" by Keith B. Kahen et al.; and commonly assigned U.S. patent application Ser. No. 10/066,829 filed Feb. 4, 2002 by Keith B. Kahen et al., the disclosures of which are incorporated herein by reference.

FIELD OF THE INVENTION

The present invention relates to an organic vertical cavity laser light producing device with periodic gain region(s).

BACKGROUND OF THE INVENTION

Vertical cavity surface emitting lasers (VCSELs) based on inorganic semiconductors (e.g. AlGaAs) have been developed since the mid-80's (K. Kinoshita et al., IEEE J. Quant. Electron. QE-23, 882 [1987]). They have reached the point where AlGaAs-based VCSELs emitting at 850 nm are manufactured by a number of companies and have lifetimes beyond 100 years (K. D. Choquette et al., Proc. IEEE 85, 1730 [1997]). With the success of these near-infrared lasers in recent years, attention has turned to other inorganic material systems to produce VCSELs emitting in the visible wavelength range (C. Wilmsen et al., *Vertical-Cavity Surface-Emitting Lasers*, Cambridge University Press, Cambridge, 2001). There are many fruitful applications for visible lasers, such as, display, optical storage reading/writing, laser printing, and short-haul telecommunications employing plastic optical fibers (T. Ishigure et al., Electron. Lett. 31, 467 [1995]). In spite of the worldwide efforts of many industrial and academic laboratories, much work remains to be done to create viable laser diodes (either edge emitters or VCSELs) which span the visible spectrum.

In the effort to produce visible wavelength VCSELs, it would be advantageous to abandon inorganic-based systems and focus on organic-based laser systems, since organic-based gain materials can enjoy the properties of low unpumped scattering/absorption losses and high quantum efficiencies. In comparison to inorganic laser systems, organic lasers are relatively inexpensive to manufacture, can be made to emit over the entire visible range, can be scaled to arbitrary size, and most importantly, are able to emit multiple wavelengths (such as red, green, and blue) from a single chip.

The usual route for making a manufacturable laser diode system is to use electrical injection rather than optical pumping to create the necessary population inversion in the active region of the device. This is the case for inorganic systems since their optically pumped thresholds (P. L. Gourley et al., Appl. Phys. Lett. 54, 1209 [1989]) for broad-area devices are on the order of $10^4$ W/cm$^2$. Such high power densities can only be achieved by using other lasers as the pump sources, precluding that route for inorganic laser cavities. Unpumped organic laser systems have greatly reduced combined scattering and absorption losses (~0.5 cm$^{-1}$) at the lasing wavelength, especially when one employs a host-dopant combination as the active media. As a result, optically pumped power density thresholds below 1 W/cm$^2$ should be attainable, especially when a VCSEL-based microcavity design is used in order to minimize the active volume (which results in lower thresholds). The importance of power density thresholds below 1 W/cm$^2$ is that it becomes possible to optically pump the laser cavities with inexpensive, off-the-shelf, incoherent LED's.

In order to produce single-mode (or a few modes) milliwatt output power from an organic VCSEL device, typically it is necessary to have the diameter of the emitting area be on the order of 10 $\mu$m. As a result, 1 mW of output power would require that the device be optically pumped by a source producing ~6000 W/cm$^2$ (assuming a 25% power conversion efficiency). This power density level (and pixel size) is far beyond the capabilities of LED's and, additionally, would most likely cause some degradation problems with the organic materials if they were driven cw. A path around that problem is to increase the organic laser's emitting area diameter to around 350 $\mu$m, which would reduce the pump power density level to 4 W/cm$^2$ (to produce 1 mW of output power). This power density level and pixel size is achievable by off-the-shelf 400 nm inorganic LED's. Unfortunately, broad-area laser devices having 350 $\mu$m diameter emitting areas would lead to highly multimode output and to lower power conversion efficiencies (as a result of filamentation). As a result, it is highly advantageous to produce large area organic VCSEL devices, which have good power conversion efficiencies and single-mode (or a few modes) output.

SUMMARY OF THE INVENTION

It is an object of this invention to provide a way of making an organic emitting laser arrangement that is particularly suitable to permit laser emission from a two-dimensional array of micron-sized organic laser pixels.

These objects are achieved by A vertical cavity laser array device, comprising:
   a) a substrate;
   b) a bottom dielectric stack reflective to light over a predetermined range of wavelengths and being disposed over the substrate;
   c) an active region for producing laser light;
   d) a top dielectric stack spaced from the bottom dielectric stack and reflective to light over a predetermined range of wavelengths;
   e) the active region includes one or more periodic gain region(s) and spacer layers disposed on either side of the periodic gain region(s) and arranged so that the periodic gain region(s) is aligned with the antinodes of the device's standing wave electromagnetic field;
   f) means for modulating the properties of the periodic gain region(s) at spaced locations so as to provide an array of spaced laser pixels which have higher net gain than the interpixel regions; and
   g) the spaced laser pixels having the same or different sizes and the spacings between pixels having the same or different lengths to cause the output of the vertical cavity laser array device to produce single or multi-mode laser output.

ADVANTAGES

It is an advantage of the present invention to provide a way of making a two-dimensional organic laser array device employing micron-sized laser pixels which can be optically driven by large area sources and produce either single or multi-mode laser output. The devices incorporate high reflectance dielectric stacks for both the top and bottom reflectors; and have a gain media including organic material. The micron-sized laser pixels of the device are provided by selectively modulating the net gain of the organic gain media. The modulation of the net gain is obtained either by selectively absorbing the optical pump beam (and preventing it from being absorbed by the gain media) or by selectively spoiling the emission properties of the gain media. As a result of selectively modulating the net gain of the organic gain media, single or multimode (a few modes) laser output is obtained from a two-dimensional organic laser array device.

DETAILED DESCRIPTION OF THE INVENTION

Figure 1:
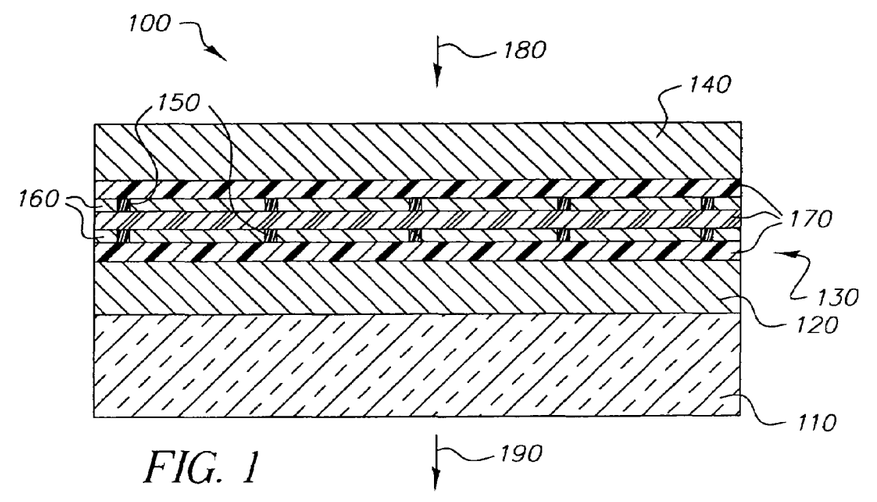
FIG. 1 shows a side view schematic of an optically pumped two-dimensional organic vertical cavity laser array made in accordance with the present invention.
Figure 2:
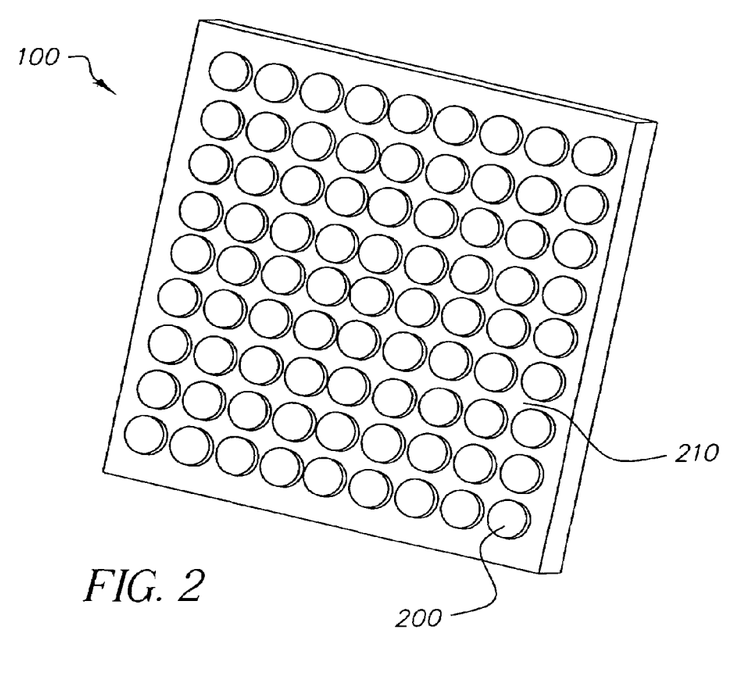
FIG. 2 shows a top view schematic of an optically pumped two-dimensional organic vertical cavity laser array made in accordance with the present invention.

To enable a large area laser structure which emits single or multi-mode (a few modes), it is necessary to construct a two-dimensional laser array device 100 as shown schematically in FIG. 1 and in accordance with the present invention. FIG. 2 shows a top view of the two-dimensional laser array device 100 where on the surface of the VCSEL needs to be defined lasing pixels 200 separated by interpixel regions 210. If single mode lasing action is desired, then the emission from the various pixels needs to be phase-locked, i.e., intensity and phase information must be exchanged amongst the pixels. This is best obtained by weakly confining the laser emissions to the pixel regions by either small amounts of built-in index or gain guiding and arranging the pixels in a periodic two-dimensional array. For the laser pixels 200 arranged in a square two-dimensional array, phase-locked operation results in each element being 180 degrees out of phase with its four nearest neighbors (E. Kapon and M. Orenstein, U.S. Pat. No. 5,086,430). As applied to two-dimensional inorganic laser arrays, a fruitful route for obtaining weak confinement of the laser emission to the laser pixels is to modulate the reflectance of the top dielectric stack by either adding metal (E. Kapon and M. Orenstein, U.S. Pat. No. 5,086,430) or by deep etching into the top dielectric stack (P. L. Gourley et al., Appl. Phys. Lett. 58, 890 [1991]). In both inorganic laser array cases, the laser pixels were on the order of 3–5 µm wide (so as to enable single-mode action) and the interpixel spacing was 1–2 µm.

It has been found that modulating the reflectance by adding metal is difficult to control since the modulation is only effective over a very narrow (<1 nm) wavelength range. Applying either of these inorganic laser results to organic laser systems requires some care since it is very difficult to perform micron-scale patterning on the laser structure once the organic layers have been deposited. A different way to attack the problem is to note that etching the stack (or adding metal to it) results in a localized change in the net gain of the device. Another means of modulating the net gain of the device is to directly impact the gain media in the active region 130. Two possibilities are either to selectively spoil the emissive properties of the gain media or to minimize the pump-beam's 180 excitation of the gain media by selectively depositing a layer that absorbs the pump-beam 180 light prior to it entering the active region 130. A straightforward way to spoil the emissive properties of organic gain media is to expose it to high levels of UV radiation. In both cases, the interpixel regions 210 are defined by where the net gain is lowered (through either spoiling the emissive properties or by absorbing the pump-beam 180 light), while the two-dimensional array of laser pixels 200 corresponds to the regions where the net gain is unmodified. Forming a linear array of laser pixels 200 is possible, even though it is not preferred in most instances since it would lead to poorer conversion of the incoming pump-beam 180 power. Even though weak confinement of the laser emission to the laser pixels 200 via net gain modulation can lead to phase-locked single mode lasing action in the best case, if phase-locking is only localized or if higher-order array modes are prevalent, then multimode lasing action will occur. In instances where reduction of speckle is important, for example in display applications, then multimode lasing action is preferred. In such cases, in order to spoil even localized phase-locking, the size of the laser pixels 200 can be randomly varied from site to site, as well as placing the pixels on a randomly-arranged two-dimensional array.

Referring back to FIG. 1, the substrate 110 can either be light transmissive or opaque, depending on the intended directions of optical pumping and laser emission. The substrate 110 can be transparent glass or plastic. Alternatively, opaque substrates including, but not limited to, semiconductor materials (e.g., silicon) or ceramic materials can be used in the case where optical pumping and laser emission occur from the same surface. On the substrate 110 is deposited the bottom dielectric stack 120 which is composed of alternating high and low refractive index dielectric materials. In general, the bottom dielectric stack 120 is designed to be reflective to laser light over a predetermined range of wavelengths. Typical high and low refractive index materials are $TiO_2$ and $SiO_2$, respectively. The bottom dielectric stack 120 is deposited by standard electron-beam deposition, where a typical deposition temperature is 240° C.

The active region 130 is deposited over the bottom dielectric stack 120. FIG. 1 shows that the active region 130 is not a bulk layer but a multilayer composite. Following the suggestions of Brueck et al. (U.S. Pat. No. 4,881,236) for inorganic lasers, the active region 130 contains one or more periodic gain regions 160, which are separated by spacer layers 170. The thickness of the periodic gain regions 160 is typically less than 50 nm, with a preferred thickness of 5 to 30 nm. The thicknesses of the spacer layers 170 are chosen such that the periodic gain region(s) is aligned with the antinodes of the laser cavity's standing electromagnetic field (e-field). Employing periodic gain region(s) in the active region results in larger power conversion efficiencies and a large reduction in the unwanted spontaneous emission. In summary, the active region 130 includes one or more periodic gain regions 160 and spacer layers 170 disposed on either side of the periodic gain region(s) and arranged so that the periodic gain region(s) is aligned with the antinodes of the device's standing wave electromagnetic field.

The periodic gain region(s) 160 is composed of either small-molecular weight organic material or polymeric organic material, which fluoresce with a high quantum efficiency. The small-molecular weight organic material is typically deposited by high-vacuum ($10^{-6}$ Torr) thermal evaporation, while the conjugated polymers are usually formed by spin casting.

Unless otherwise specifically stated, use of the term "substituted" or "substituent" means any group or atom other than hydrogen. Additionally, when the term "group" is used, it is meant that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group can be halogen or can be bonded to the remainder of the molecule by an atom of carbon, silicon, oxygen, nitrogen, phosphorous, sulfur, selenium, or boron. The substituent can be, for example, halogen, such as chloro, bromo or fluoro; nitro; hydroxyl; cyano; carboxyl; or groups which can be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2, 4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2 -methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2, 4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecylphenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]-sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy) acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxy-sulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which can be substituted and which contain a 3 to 7 membered heterocyclic ring composed of carbon atoms and at least one hetero atom selected from the group including oxygen, nitrogen, sulfur, phosphorous, or boron. such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents can themselves be further substituted one or more times with the described substituent groups. The particular substituents used can be selected by those skilled in the art to attain the desired properties for a specific application and can include, for example, electron-withdrawing groups, electron-donating groups, and steric groups. When a molecule can have two or more substituents, the substituents can be joined together to form a ring such as a fused ring unless otherwise provided. Generally, the above groups and substituents thereof can include those having up to 48 carbon atoms, typically 1 to 36 carbon atoms and usually less than 24 carbon atoms, but greater numbers are possible depending on the particular substituents selected. Substitution can include fused ring derivatives such as, but not limited to benzo-, dibenzo-, naphtha-, or dinaphtho-fused derivatives. These fused ring derivatives can be further substituted as well.

The periodic gain region(s) 160 (or emissive material) can be comprised of a single host material, but more commonly includes a host material doped with a guest compound (dopant) or compounds where light emission comes primarily from the dopant and can be of any color. These host-dopant combinations are advantageous since they result in very small unpumped scattering/absorption losses for the gain media (can be less than 1 $cm^{-1}$). The dopant is usually chosen from highly fluorescent dyes, but phosphorescent compounds, e.g., transition metal complexes as described for OLED applications in WO 98/55561, WO 00/18851, WO 00/57676, and WO 00/70655 are also useful. Dopants are typically coated as 0.01 to 10% by weight into the host material, wherein they can be selected to provide emitted light having hues of either red, green, or blue. An example of a useful host-dopant combination for red emitting layers is Alq as the host material and 1% L39 [4-(dicyanomethylene)-2-t-butyl-6-(1,1,7,7-tetramethyljulolidyl-9-enyl)-4H-pyran] as the dopant.

An important relationship for choosing a dye as a dopant is a comparison of the absorption of the dopant material and emission of the host material. For efficient energy transfer (via Forster energy transfer) from the host to the dopant molecule, a necessary condition is that the absorption of the dopant overlaps the emission of the host material. Those skilled in the art are familiar with the concept of Forster energy transfer, which involves a radiationless transfer of energy between the host and dopant molecules. An important relationship for choosing the host material is that the absorption of the host material significantly overlaps the emission spectrum of the pump-beam 180 light. In addition it is preferred that the absorption of the host material or a host material plus a dopant is small at the laser emission wavelength of the device 100. An acceptable level of absorption is that the absorption coefficient of the host plus dopant combination is less than 10 cm$^{-1}$ at the wavelength of the laser emission.

Useful fluorescent emissive materials includes polycyclic aromatic compounds as described in I. B. Berlman, "Handbook of Fluorescence Spectra of Aromatic Molecules," Academic Press, New York, 1971 and EP 1 009 041. Tertiary aromatic amines with more than two amine groups can be used including oligomeric materials.

Another class of useful emissive materials (for host or dopants) include aromatic tertiary amines, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or an oligomeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

A wherein:
  $Q_1$ and $Q_2$ are independently selected aromatic tertiary amine moieties; and
  G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

B where:
  $R_1$ and $R_2$ each independently represent a hydrogen atom, an aryl group, or an alkyl group or $R_1$ and $R_2$ together represent the atoms completing a cycloalkyl group; and
  $R_3$ and $R_4$ each independently represent an aryl group, which is in turn substituted with a diaryl substituted amino group, as indicated by structural Formula C.

C wherein $R_5$ and $R_6$ are independently selected aryl groups. In one embodiment, at least one of $R_5$ or $R_6$ contains a polycyclic fused ring structure, e.g., a naphthalene.

The host material can comprise a substituted or unsubstituted triarylamine compound. Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

D wherein:
  each Are is an independently selected arylene group, such as a phenylene or anthracene moiety;
  n is an integer of from 1 to 4; and
  Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The emissive material can be formed of a single or a mixture of aromatic tertiary amine compounds. Specifically, one can employ a triarylamine, such as a triarylamine satisfying the Formula B, in combination with a tetraaryldiamine, such as indicated by Formula D. The host material can include a substituted or unsubstituted dicarbazole-biphenyl compound. Illustrative of useful aromatic tertiary amines is the following:

4,4'-N,N'-dicarbazole-1,1'-biphenyl (CBP) (D1)
4,4'-Bis[N-(1-naphthyl)-N-phenylamino]biphenyl (D2)
4,4'-Bis[N-(1-naphthyl)-N-(2-naphthyl)amino]biphenyl (D3)
4,4'-Bis[N-(2-naphthyl)-N-p-tolylamino]biphenyl (D4)
1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine.

The host material can comprise a substituted or unsubstituted aza-aromatic compound. For example, the host material can comprise a substituted or unsubstituted acridine, quinoline, purine, phenazine, phenoxazine, or phenanthroline compound. Carbazole derivatives are useful hosts. Useful examples of phenanthroline materials include 2,9-dimethyl-4,7-diphenyl-1,10-phenanthroline and 4,7-diphenyl-1,10-phenanthroline.

Host and dopant molecules include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

wherein:
M represents a metal;
n is an integer of from 1 to 3; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material can comprise a substituted or unsubstituted chelated oxinoid compound.

Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

The host material can include a substituted or unsubstituted anthracene compound.

Derivatives of 9,10-di-(2-naphthyl)anthracene (Formula F) constitute one class of useful hosts capable of supporting photoluminescence, and are particularly suitable for light emission of wavelengths longer than 400 nm, e.g., blue, green, yellow, orange or red.

wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxyamino, alkylamino, or arylamino of from 1 to 24 carbon atoms; and Group 6: fluorine, chlorine, bromine or cyano.

Illustrative examples include 9,10-di-(2-naphthyl)anthracene (F1) and 2-t-butyl-9,10-di-(2-naphthyl)anthracene (F2). Other anthracene derivatives can be useful as a host, including derivatives of 9,10-bis-(4-(2,2'-diphenylethenyl)phenyl)anthracene.

Benzazole derivatives (Formula G) constitute another class of useful hosts capable of supporting photoluminescence, and are particularly suitable for light emission of wavelengths longer than 400 nm, e.g., blue, green, yellow, orange or red.

where:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit including alkyl, aryl, substituted alkyl, or substituted aryl, which conjugately or unconjugately connects the multiple benzazoles together. An example of a useful benzazole is 2, 2', 2"-(1,3,5-phenylene)tris[1-phenyl-1H-benzimidazole].

The host material can comprise a substituted or unsubstituted benzoxazole compound, a substituted or unsubstituted benzthiazole compound, or a substituted or unsubstituted benzimidazole compound. The host material can comprise a substituted or unsubstituted oxazole compound, a substituted or unsubstituted triazole compound, or a substituted or unsubstituted oxadiazole compound. Useful examples of oxazole compounds include 1,4-bis(5-phenyloxazol-2-yl)benzene, 1,4-bis(4-methyl-5-phenyloxazol-2-yl)benzene, and 1,4-bis(5-(p-biphenyl)oxazol-2-yl)benzene. Useful examples of oxadiazole compounds include 2-(4-biphenylyl)-5-phenyl-1,3,4-oxadiazole and 2-(4-biphenylyl)-5-(4-tert-butylphenyl)-1,3,4-oxadiazole. Useful examples of triazole compounds include 3-(4-biphenylyl)-4-phenyl-5-tert-butylphenyl-1,2,4-triazole.

Distyrylarylene derivatives are also useful as host materials or dopant materials, many examples are described in U.S. Pat. No. 5,121,029. Useful emissive materials (hosts and dopants) can have the general Formulae (H) or (I):

where:

X and Z are independently a substituted or unsubstituted aromatic group or a substituted or unsubstituted aromatic complex ring group having one nitrogen atom;

n equals 1, 2, or 3; and

Y is a divalent aromatic group or a divalent aromatic complex ring group having one nitrogen atom. Useful examples include 1,4-bis(2-methylstyryl)-benzene, 4,4'-(9,10-anthracenediyldi-2,1-ethenediyl)bis(N,N-bis(4-methylphenyl)-benzenamine, 4,4'-(1,4-naphthalenediyldi-2,1-ethenediyl)bis(N,N-bis(4-methylphenyl) benzenamine, and 4,4'-(1,4-phenylenedi-2,1-ethenediyl)bis(N,N-(4-tolyl))benzeneamine.

The dopant is selected to provide emission between 300–1700 nm. The dopant can be selected from fluorescent or phosphorescent dyes. Useful fluorescent dopants include materials as described as host materials above. Other useful fluorescent dopants include, but are not limited to, derivatives of substituted or unsubstituted anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, napthyridine, fluoranthene, furan, indole, thiaphene, benzoxanthene, pyrene, peropyrene, terphenyl, quaterphenyl, quinquephenyl, sexiphenyl, anthanthrene, bisanthrene compounds, N,N,N',N'-tetrasubstituted benzidene derivatives, N,N,N',N'-tetrarylbenzidene derivatives and carbostyryl compounds or combinations thereof. Derivatives of these classes of materials can also serve as useful host materials or combinations thereof. Host materials will often be compounds containing at least three phenylene moieties.

Illustrative examples of useful dopants include, but are not limited to, the following:

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

| | R |
|---|---|
| L37 | phenyl |
| L38 | methyl |
| L39 | t-butyl |
| L40 | mesityl |

| | R |
|---|---|
| L41 | phenyl |
| L42 | methyl |
| L43 | t-butyl |
| L44 | mesityl |

L45

L46

L47

L48

-continued

L49

L50

L51

L52

L53

L54

-continued

L55

L56

L57

L58

L59

-continued

L60

L61

L62

Other emissive materials include various heterocyclic optical brighteners as described in U.S. Pat. No. 4,539,507.

The emissive material can also be a polymeric material, a blend of two or more polymeric materials, or a doped polymer or polymer blend. The emissive material can also be a combination of more than one nonpolymeric and polymeric materials with or without dopants. Typical dopants are listed previously for nonpolymeric molecules. Nonpolymeric dopants can be molecularly dispersed into the polymeric host, or the dopant could be added by copolymerizing a minor constituent into the host polymer. Typical polymeric materials include, but are not limited to, substituted and unsubstituted poly(p-phenylenevinylene) (PPV) derivatives, substituted and unsubstituted poly(p-phenylene) (PPP) derivatives, substituted and unsubstituted polyfluorene (PF) derivatives, substituted and unsubstituted poly(p-pyridine), substituted and unsubstituted poly(p-pyridalvinylene) derivatives, and substituted, unsubstituted poly(p-phenylene) ladder and step-ladder polymers, and copolymers thereof as taught by Diaz-Garcia et al. in U.S. Pat. No. 5,881,083 and references therein. The substituents include but are not limited to alkyls, cycloalkyls, alkenyls, aryls, heteroaryls, alkoxy, aryloxys, amino, nitro, thio, halo, hydroxy, and cyano. Typical polymers are poly(p-phenylene vinylene), dialkyl-, diaryl-, diamino-, or dialkoxy-substituted PPV, mono alkyl-mono alkoxy-substituted PPV, mono aryl-substituted PPV, 9,9'-dialkyl or diaryl-substituted PF, 9,9'-mono alky-mono aryl substituted PF, 9-mono alky or aryl substituted PF, PPP, dialkyl-, diamino-, diaryl-, or dialkoxy-substituted PPP, mono alkyl-, aryl-, alkoxy-, or amino-substituted PPP. In addition, polymeric materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357).

Most organic laser devices are sensitive to moisture or oxygen, or both, so they are commonly sealed in an inert atmosphere such as nitrogen or argon. Desiccant such as alumina, bauxite, calcium sulfate, clays, silica gel, zeolites, alkaline metal oxides, alkaline earth metal oxides, sulfates, or metal halides and perchlorates can be incorporated into the sealed device. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

For the spacer layer 170 it is preferred to use a material that is highly transparent to both the laser emission 190 and the pump-beam 180. In this embodiment 1,1-Bis-(4-bis(4-methyl-phenyl)-amino-phenyl)-cyclohexane (TAPC) was chosen as the spacer material, since it has very low absorption throughout the visible and near UV spectrum and its index of refraction is slightly lower than that of most organic host materials. This refractive index difference is useful since it helps in maximizing the overlap between the standing e-field antinodes and the periodic gain region(s) 160. Besides organic spacer materials, the spacer layer 170 can also be composed of inorganic materials, such as, $SiO_2$, since it has low absorption and its index of refraction is less than that of organic host materials. When using inorganic-based spacer layers, the materials can be deposited either by thermal evaporation or by e-beam at low deposition temperatures (around 70° C.).

Following the deposition of the active region 130, it is necessary to spatially pattern the net gain of the periodic gain region(s) 160 in order to form the lower net gain regions 150. For the embodiment shown in FIG. 1, the lower net gain regions 150 are created by locally spoiling the emissive properties of the periodic gain region(s) 160. An effective way to form the lower net gain regions 150 is to use standard photolithographic masks and UV exposing apparatus in order to create a patterned UV exposure of the periodic gain region(s) 160. Since organic media is sensitive to high intensity UV light (for example the mercury arc lamp's i-line at 365 nm), this technique works very effectively to lower the emissive intensity of the UV exposed areas of the periodic gain region(s) 160. As discussed above, the UV exposed areas (the lower net gain regions 150) correspond to the interpixel region 210, while the unexposed areas correspond to the laser pixels 200. In the preferred embodiment the shape of the laser pixels 200 is circular; however, other pixel shapes are possible, such as, rectangular. The size of the laser pixels 200 is in the range of 2.5 to 20 microns. For single mode laser operation, the preferred laser pixel 200 diameter is 3 to 5 µm. The interpixel spacing is in the range of 0.25 to 4 µm. In general, the spaced laser pixels 200 can have the same or different sizes and the spacings between pixels can have the same or different lengths to cause the output of the two-dimensional laser array device 100 to produce single or multimode laser output. It should be noted that the emissive intensity of the periodic gain region(s) 160 can be locally modulated by means other than high intensity UV radiation, such as, those means commonly practiced in the art.

Following the growth of the active region 130 and the creation of the lower net gain regions 150, is the deposition of the top dielectric stack 140. The top dielectric stack 140 is spaced from the bottom dielectric stack 120 and reflective to light over a predetermined range of wavelengths. Its composition is analogous to that of the bottom dielectric stack. Since the top dielectric stack 140 is deposited over an active region 130 which contains organics, its deposition temperature must be kept low in order to avoid melting the organics. As a result, a typical deposition temperature for the top dielectric stack 140 is 70° C. In order to obtain good lasing performance, it is preferred that the peak reflectivities of the top and bottom dielectric stacks be greater than 99%, where smaller values result in larger lasing linewidths.

The two-dimensional laser array device 100 is optically driven by an incident pump-beam source 180 and emits laser emission 190. Depending on the lasing power density threshold of the organic laser cavity, the pump-beam can be either focused laser light or incoherent LED light. FIG. 1 shows laser emission 190 through the substrate 110. Alternatively, the laser structure could be optically pumped through the substrate 110 with the laser emission 190 through the top dielectric stack 140 by proper design of the dielectric stack reflectance properties. In the case of an opaque (e.g., silicon) substrate, both optical pumping and laser emission occurs through the top dielectric stack 140. The operation of the two-dimensional laser array device 100 occurs by the following means. The pump-beam 180 transmits through the top dielectric stack 140 and is absorbed by the periodic gain region(s) 160, wherein some fraction of the pump-beam energy is re-emitted as longer wavelength laser light at the position of the laser pixels 200. When the pump-beam 180 enters through the top dielectric stack 140, to ensure that the laser emission 190 mainly exits through the substrate 110, it is necessary to choose the top dielectric stack peak reflectance to be greater than the bottom dielectric stack peak reflectance. To improve the power conversion efficiency of the device, it is common practice to add additional dielectric layers to both dielectric stacks, such that, the bottom dielectric stack 120 is highly reflective to the pump-beam 180 and the top dielectric stack 140 is highly transmissive to the pump-beam.

In an alternative embodiment of the present invention, the top dielectric stack 140 is replaced by the deposition of a reflective metal mirror layer. Typical metals are silver or aluminum, which have reflectivities in excess of 90%. It is preferred that the metals be deposited by vacuum thermal evaporation to avoid causing damage to the underlying organic layers. In this alternative embodiment, both the pump-beam 180 and the laser emission 190 would proceed through the substrate 110. Besides this change, the layer structure and operation of the laser array device is analogous to the case where the both mirrors are composed of multilayer dielectrics.

Figure 3:
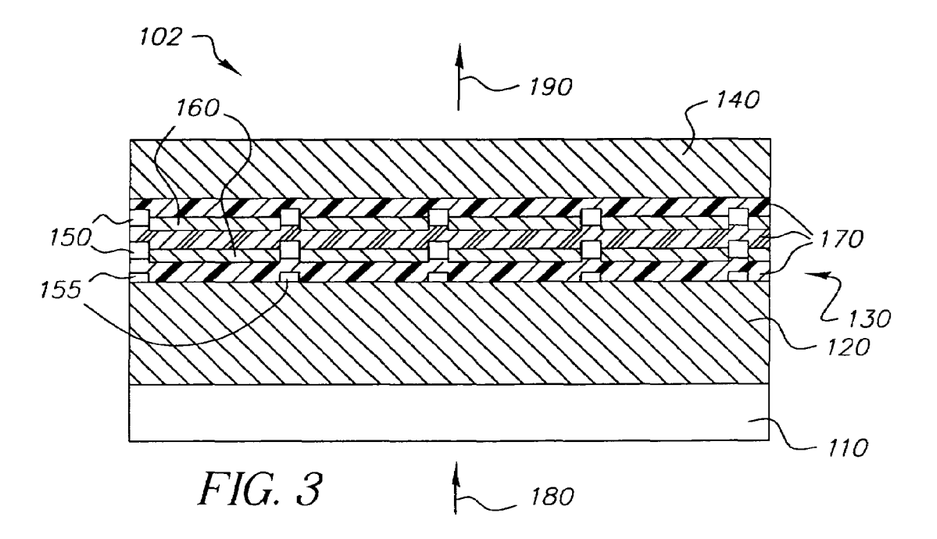
FIG. 3 shows a side view schematic of an optically pumped two-dimensional organic vertical cavity laser array made in accordance with the present invention which incorporates an absorbing layer.

As discussed above, another means for spatially modulating the net gain of the periodic gain region(s) 160 is to modulate the excitation of the periodic gain region(s) 160 by the pump-beam 180. Another embodiment of the present invention is given in FIG. 3, laser array device 102, which contains absorbing elements 155. In order to form micron-sized laser pixel features, it is preferred that the absorbing elements 155 be placed adjacent to the active region 130. As discussed above, performing photolithographic-based processing on laser devices is difficult once the organics have been deposited, accordingly it is preferred to place the absorbing elements between the bottom dielectric stack 120 and the active region 130 as shown in FIG. 3. The composition of the absorbing elements 155 is any material that absorbs the pump-beam 180 light, while it also does not scatter the laser emission 190. It is preferred that at the emission wavelengths of the pump-beam 180, the absorbing elements' 155 absorption coefficient is greater than $10^4$ cm$^{-1}$. It is also preferred that the material comprising the absorbing elements 155 be photoimageable in order to simplify the process of patterning the absorbing elements 155. Candidate materials are photoimageable carbon black and pigmented photoresist. Both can be deposited by spin casting and patterned by standard photolithographic techniques. The thickness of the absorbing elements 155 is chosen such that a significant percentage of the pump-beam 180 light is absorbed by the layer. A preferred absorption fraction is greater than 50%. Following the creation of the spaced-apart absorbing elements 155, the active region 130 and top dielectric stack 140 are deposited in sequence. Since the absorbing elements 155 need to be placed between the bottom dielectric stack 120 and the active region 130, and absorb a portion of the pump-beam 180 light, it is necessary for the pump-beam 180 to enter through the substrate 110. If the absorbing elements 155 are not photoimageable, then they can be patterned to form spaced apart elements by other means commonly practiced in the art. For example, etched pits can be formed in a transparent layer (such as $SiO_2$), over which can be deposited the absorbing element 155 material. Next standard chemical mechanical polishing (CMP) techniques can be used to polish down the absorbing element 155 material such that it only remains in the etched pit regions. As discussed above, the positions of the absorbing elements 155 correspond to the interpixel region 210, while the remaining areas correspond to the laser pixels 200. In the preferred embodiment the shape of the laser pixels 200 is circular; however, other pixel shapes are possible, such as, rectangular. The size of the laser pixels 200 is in the range of 2.5 to 20 microns. For single mode laser operation, the preferred laser pixel 200 diameter is 3 to 5 µm. The interpixel spacing is in the range of 0.25 to 4 µm. In general, the spaced laser pixels 200 can have the same or different sizes and the spacings between pixels can have the same or different lengths to cause the output of the two-dimensional laser array device 100 to produce single or multimode laser output.

Figure 4:
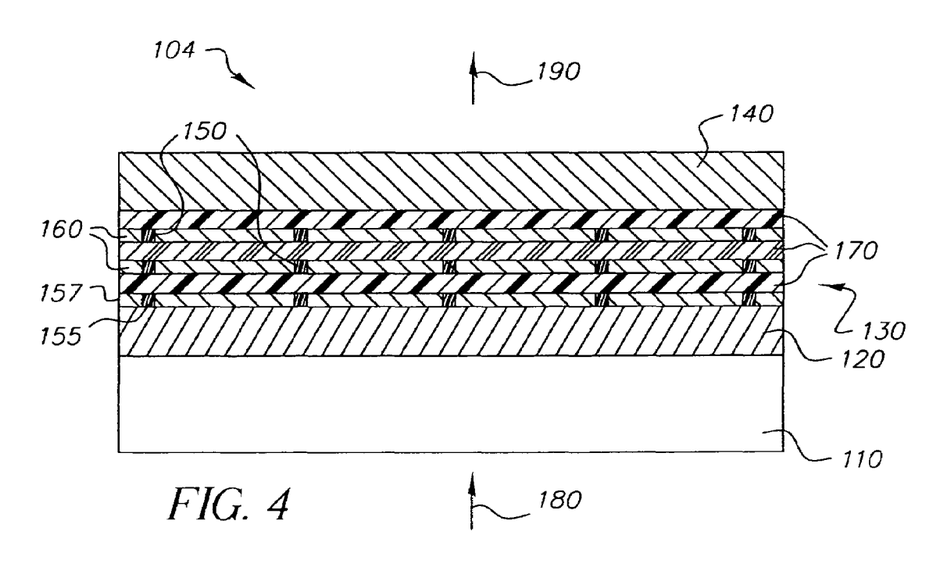
FIG. 4 shows a side view schematic of an optically pumped two-dimensional organic vertical cavity laser array made in accordance with the present invention which incorporates a planarized absorbing layer.

FIG. 4 shows another embodiment of the present invention. This laser array device 104 is a variation of the one illustrated in FIG. 3. In FIG. 3 the active region 130 is grown directly on the absorbing elements 155. As a result, the active region 130 and the top dielectric stack 140 are deposited on a non-planar (corrugated) surface. For certain multilayer stack combinations, such as, $TiO_2$—$SiO_2$, deposition on a corrugated surface can lead to columnar growth of the stacks. As a result, there is enhanced scattering losses in the top dielectric stack 140. To overcome this problem, the absorbing elements 155 are planarized by a planarization layer 157, using techniques well-known in the art, prior to depositing the active region 130. In one embodiment following the creation of the spaced apart absorbing elements 155, the planarization layer 157 material is deposited by suitable processes. Next, using CMP techniques which are well known in the art, the planarization layer 157 material is polished until it is flush (or within a couple tens of nanometers) with the top surface of the absorbing elements 155. A second embodiment of the planarization layer 157 is to use polymethyl-methacrylate (PMMA). In this case PMMA is spun cast over the spaced apart absorbing elements 155 to a thickness range of 0.5 to 3.0 $\mu M$, followed by a conventional bake at 150 to 220° C. Scanning electron microscope (SEM) images reveal that a 3:1 or 4:1 PMMA thickness to absorbing element thickness ratio typically results in the planarization of the PMMA surface. Besides these two embodiments for planarization, other methodologies are possible as practiced by those skilled in the art. In summary, the addition of the planarization layer 157 following the creation of the spaced apart absorbing elements 155 and prior to the deposition of the active region 130, leads to less scattering loss in the active region 130 and in the top dielectric stack 140 and results in higher power conversion efficiencies.

The following example is presented as further understandings of the present invention and is not to be construed as limitations thereon.

EXAMPLE 1

In order to determine the lasing characteristics of the two-dimensional laser array of FIGS. 1 and 2, laser structures were grown on pre-cleaned 6-inch quartz substrates. Over the substrate was deposited, by conventional electron-beam deposition, the bottom dielectric stack 120, which was composed of alternating high and low refractive index layers of $TiO_2$ and $SiO_2$ (a total of 23 layers) respectively. The bottom dielectric stack 120 was designed to reflect light both at 560 nm (the lasing wavelength) and at the pump-beam wavelength of 405 nm (to boost the absorption of the pump-beam 180 by the periodic gain regions 160). As a result the bottom dielectric stack 120 had a measured peak reflectance of ~99.4% at 560 nm and a reflectance of ~91% at 405 nm. On top of the bottom dielectric stack 120 was deposited, by high vacuum thermal evaporation, the active region 130, where in order was grown 153 nm of TAPC, 25 nm of Alq with 0.5% of [10-(2-benzothiazolyl)-2,3,6,7-tetrahydro-1,1,7,7-tetramethyl-1H,5H,11H-[1]Benzopyrano[6,7,8-ij]quinolizin-11-one] (C545T), 140 nm of TAPC, 25 nm of Alq with 0.5% of C545T and 153 nm of TAPC. Next, a high resolution photolithographic Canon stepper was used to selectively expose (using a standard photolithographic mask) the perioidic gain regions 160 to high intensity UV radiation (i-line irradiation) at a total dosage of 66 $J/cm^2$. As a result, the unexposed areas of the periodic gain regions 160 formed a two-dimensional square array of 7 $\mu m$ circular pixels, with an edge-to-edge separation of 1.0 $\mu m$. Lastly, the top dielectric stack 140 was deposited by low temperature electron-beam deposition, such that, the measured temperature of the quartz substrate was kept below 72° C. It was composed of alternating high and low refractive index layers of $TiO_2$ and $SiO_2$, respectively. The resulting top stack dielectric mirror had a measured peak reflectance of ~99.98% at 560 nm.

To test the device for its spectral characteristics, the laser array was optically pumped as illustrated in FIG. 1 (at normal incidence to the top dielectric stack 140) using the 405 nm output from a 5 mW Nichia laser diode. The pump laser produced 50 nsec laser pulses at a repetition rate of 50 KHz. The pump-beam intensity was adjusted by the combination of two neutral density wheels and it was focused onto the laser cavity surface using a 1000 mm focal-length lens. The resulting measured pump-beam 180 spot size on the device surface was 177×243 $\mu m$. The laser emission 190 from the cavity was focused on to the entrance slit of a JY-Horiba double monochrometer (0.55 m) by the combination of a 35 mm f1.4 lens and a 100 mm f4 lens nearest the slit (resulting in a 2.9× magnification of the laser's near-field image). The resolution of the monochrometer is approximately 0.08 nm; its output was detected by a cooled Hamamatsu photomultiplier tube.

Figure 5:
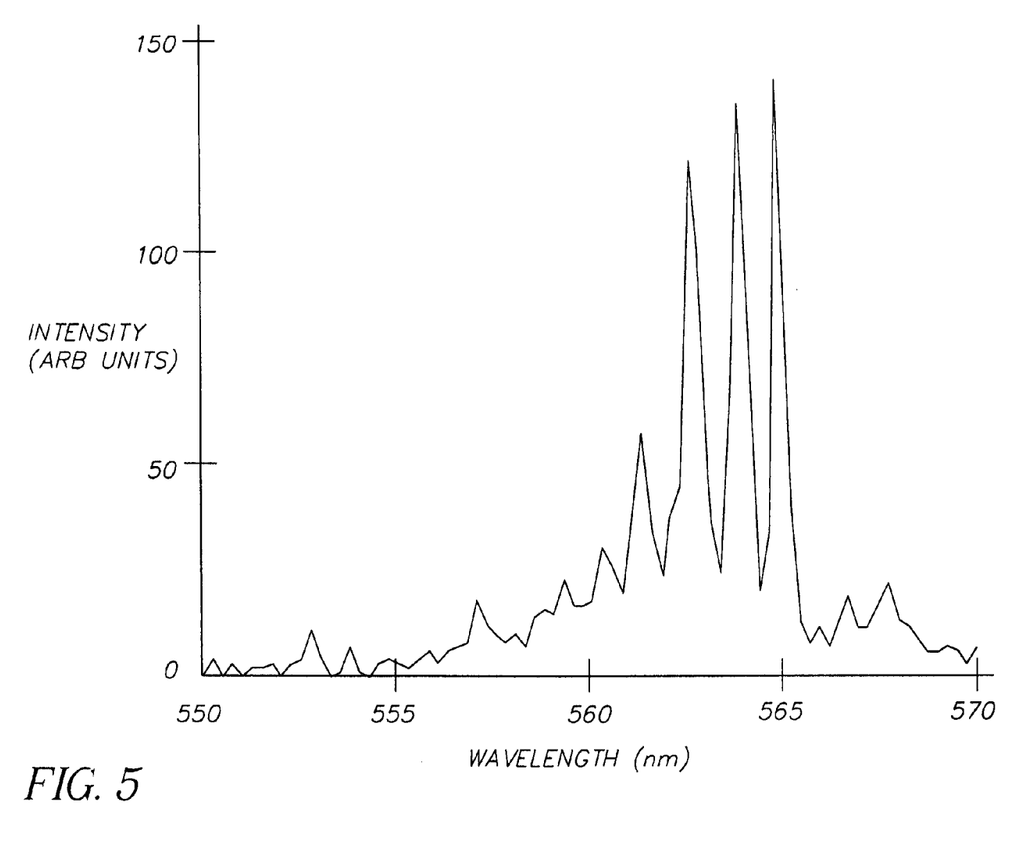
FIG. 5 shows a graph of intensity vs. wavelength and depicts the laser emission spectra for an optically pumped two-dimensional organic vertical cavity laser array made in accordance with the present invention.

FIG. 5 shows the laser spectrum collected by the 0.36 numerical aperture lens, where the two neutral density wheels were adjusted to give a pump-beam 180 power density at the device surface of 0.042 $W/cm^2$ (at least a factor of 5 above the device's lasing threshold). The device has three main laser peaks at 565, 564, and 562.7 nm, whose full-width at half-maximum (FWHM) are 0.34, 0.53 and 0.58 nm, respectively. There is also a minor lasing peak at 561.4 nm. A desirable property of these devices is that there is largely the absence of higher-order array modes which commonly occur in these types of two-dimensional laser arrays when the stack reflectance is varied in order to modulate the net gain. A possible explanation for the difference in laser output is that the higher-order array modes are typically created as a result of the lasing mode traveling across the structure and reflecting off of many neighboring pixels. Since the gain is spoiled via the high intensity UV radiation in the interpixel regions 210, the formation of these higher-order array modes is largely quenched. Consequently, modulating the net gain of an organic VCSEL device by high intensity UV radiation results in a simple way to create a two-dimensional array of micron-sized laser pixels 200 and leads to the quenching of the undesirable higher-order array modes.

The invention has been described in detail with particular reference to certain preferred embodiments thereof, but it will be understood that variations and modifications can be effected within the spirit and scope of the invention.

| PARTS LIST | |
|---|---|
| 100 | two-dimensional laser array device |
| 102 | laser array device |
| 104 | laser array device |
| 110 | substrate |
| 120 | bottom dielectric stack |
| 130 | active region |
| 140 | top dielectric stack |
| 150 | lower net gain region |
| 155 | absorbing elements |
| 157 | planarization layer |
| 160 | periodic gain region |
| 170 | spacer layer |
| 180 | pump-beam |
| 190 | laser emission |
| 200 | laser pixel |
| 210 | interpixel region |

What is claimed is:

1. A vertical cavity laser array device, comprising:
   a) a substrate;
   b) a bottom dielectric stack reflective to light over a predetermined range of wavelengths and being disposed over the substrate;
   c) an active region for producing laser light;
   d) a top dielectric stack spaced from the bottom dielectric stack and reflective to light over a predetermined range of wavelengths;
   e) the active region includes one or more periodic gain region(s) and spacer layers disposed on either side of the periodic gain region(s) and arranged so that the periodic gain region(s) is aligned with the antinodes of the device's standing wave electromagnetic field;
   f) means for modulating the properties of the periodic gain region(s) at spaced locations so as to provide an array of spaced laser pixels which have higher net gain than the interpixel regions; and
   g) the spaced laser pixels having the same or different sizes and the spacings between pixels having the same or different lengths to cause the output of the vertical cavity laser array device to produce single or multimode laser output.

2. The vertical cavity laser array device of claim 1 wherein the array providing means includes a plurality of spaced apart absorbing elements selected to absorb the pump beam light.

3. The vertical cavity laser array device of claim 1 wherein the array providing means includes altering the emissive properties of the periodic gain region(s) at spaced apart locations.

4. The vertical cavity laser array device of claim 3 wherein the emissive properties are altered by high intensity UV radiation.

5. The vertical cavity laser array device of claim 1 wherein pump-beam light is transmitted and introduced into the active region through at least one of the dielectric stacks.

6. The vertical cavity laser array device of claim 1 wherein one or more periodic gain region(s) is a combination of an organic host material and a dopant and the spacer layers are substantially transparent to pump-beam light and laser light.

7. The vertical cavity laser light producing device of claim 6 wherein the host material is aluminum tris(8-hydroxyquinoline), the dopant is [4-(dicyanomethylene)-2-t-butyl-6-(1,1,7,7-tetramethyljulolidyl-9-enyl)-4H-pyran], and the spacer layers includes 1,1-Bis-(4-bis(4-methyl-phenyl)-amino-phenyl)-cyclohexane or silicon dioxide.

8. The vertical cavity laser light producing device of claim 1 wherein the periodic gain region includes polymeric materials.

9. The vertical cavity laser array device of claim 1 wherein the spacing between pixels is in the range of 0.25 to 4 microns.

10. The vertical cavity laser array device of claim 1 wherein the size of the pixels is in the range of 2.5 to 20 microns.

11. The vertical cavity laser array device of claim 1 wherein the pixels are arranged in a linear array.

12. The vertical cavity laser array device of claim 1 wherein the pixels are arranged in a periodic two-dimensional array.

13. The vertical cavity laser array device of claim 1 wherein the pixels are arranged randomly in a two-dimensional array.

14. A vertical cavity laser light producing device, comprising:
   a) a substrate;
   b) a first dielectric stack reflective to light over a predetermined range of wavelengths and being disposed over the substrate;
   c) an active region for producing laser light;
   d) a metallic layer spaced from the first dielectric stack and reflective to light;
   e) the active region includes one or more periodic gain region(s) and spacer layers disposed on either side of the periodic gain region(s) and arranged so that the periodic gain region(s) is aligned with the antinodes of the device's standing wave electromagnetic field;
   f) means for modulating the properties of the periodic gain region(s) at spaced locations so as to provide an array of spaced laser pixels which have higher net gain than the interpixel regions; and
   g) the spaced laser pixels having the same or different sizes and the spacings between pixels having the same or different lengths to cause the output of the vertical cavity laser array device to produce single or multimode laser output.

15. The vertical cavity laser array device of claim 14 wherein the array providing means includes a plurality of spaced apart absorbing elements selected to absorb the pump beam light.

16. The vertical cavity laser array device of claim 14 wherein the array providing means includes altering the emissive properties of the periodic gain region(s) at spaced apart locations.

17. The vertical cavity laser array device of claim 16 wherein the emissive properties are altered by high intensity UV radiation.

18. The vertical cavity laser array device of claim 14 wherein pump-beam light is transmitted and introduced into the active region through at least one of the dielectric stacks.

19. The vertical cavity laser array device of claim 14 wherein one or more periodic gain region(s) is a combination of an organic host material and a dopant and the spacer layers are substantially transparent to pump-beam light and laser light.

20. The vertical cavity laser light producing device of claim 19 wherein the host material is aluminum tris(8-hydroxyquinoline), the dopant is [4-(dicyanomethylene)-2-t-butyl-6-(1,1,7,7-tetramethyljulolidyl-9-enyl)-4H-pyran], and the spacer layers includes 1,1-Bis-(4-bis(4-methyl-phenyl)-amino-phenyl)-cyclohexane or silicon dioxide.

21. The vertical cavity laser light producing device of claim 14 wherein the periodic gain region includes polymeric materials.

22. The vertical cavity laser array device of claim 14 wherein the spacing between pixels is in the range of 0.25 to 4 microns.

23. The vertical cavity laser array device of claim 14 wherein the size of the pixels is in the range of 2.5 to 20 microns.

24. The vertical cavity laser array device of claim 14 wherein the pixels are arranged in a linear array.

25. The vertical cavity laser array device of claim 14 wherein the pixels are arranged in a periodic two-dimensional array.

26. The vertical cavity laser array device of claim 14 wherein the pixels are arranged randomly in a two-dimensional array.

* * * * *